United States Patent [19]

Ono

[11] Patent Number: 4,506,381
[45] Date of Patent: Mar. 19, 1985

[54] AURAL TRANSMITTER DEVICE

[75] Inventor: Hideyo Ono, Hyogo, Japan

[73] Assignee: Mitsubishi Denki Kabushiki Kaisha, Tokyo, Japan

[21] Appl. No.: 453,545

[22] Filed: Dec. 27, 1982

[30] Foreign Application Priority Data

Dec. 29, 1981 [JP] Japan .................. 56-212419
Dec. 29, 1981 [JP] Japan .................. 56-212420
Jan. 9, 1982 [JP] Japan .................. 57-2061

[51] Int. Cl.³ .................. H04B 15/00; H03G 3/00
[52] U.S. Cl. .................. 381/94; 381/121; 381/108
[58] Field of Search .................. 381/94, 95, 96, 108, 381/121, 57, 106, 107, 110, 66, 83, 93, 104; 455/221, 223, 224, 225, 212, 218, 222, 303

[56] References Cited

U.S. PATENT DOCUMENTS

| 2,606,972 | 8/1952 | Scott | 381/94 X |
| 3,183,304 | 5/1965 | Schroeder | 381/83 |
| 3,497,830 | 2/1970 | Colton et al. | |
| 3,815,039 | 6/1974 | Fujisawa et al. | 381/94 X |
| 3,925,618 | 12/1975 | Kato et al. | |
| 4,143,325 | 3/1979 | Kahn | 381/94 X |
| 4,166,924 | 9/1979 | Berkley et al. | 381/66 |
| 4,358,738 | 11/1982 | Kahn | 381/94 X |
| 4,388,731 | 6/1983 | King | 455/303 X |
| 4,414,689 | 11/1983 | Enderson | 455/221 |

FOREIGN PATENT DOCUMENTS

| 95774 | 12/1983 | European Pat. Off. | 381/107 |
| 52-30310 | 3/1977 | Japan | 455/225 |
| 56-128004 | 10/1981 | Japan | 381/121 |
| 1427029 | 3/1976 | United Kingdom | 455/223 |

OTHER PUBLICATIONS

Forrest M. Mims, III, "Engineer's Notebook: A Handbook of Integrated Circuit Applications," ©1979 by Radio Shack.

Primary Examiner—Keith E. George
Attorney, Agent, or Firm—Sughrue, Mion, Zinn, Macpeak and Seas

[57] ABSTRACT

An aural transmitter device is improved by largely eliminating the amplification of ambient environmental noise. To this end, control may be effected in response to the difference between a smoothed, rectified output of an amplifier and a reference voltage, either with or without a high-pass filter for removing low frequency noise components.

10 Claims, 12 Drawing Figures

AURAL TRANSMITTER DEVICE

BACKGROUND OF THE INVENTION

This invention relates to an aural transmitter device in which the amplification level of the voice amplifier is controlled according to the input level of a sound signal applied through an aural transmitter (such as a microphone) or the like, whereby the effect of environmental noise is minimized.

In general, a voice amplifier for amplifying sound signals outputs a sound signal in proportion to the input level thereof.

When the output sound signal of an aural transmitter is amplified, the voice for the announcer is applied, as a relatively high sound pressure to the aural transmitter, and therefore during aural transmission environmental noises may be ignored, as they are masked by the voice.

However, when aural transmission is suspended, the environmental noises only are amplified, and are therefore offensive to the ear. Especially when the device is installed on a vehicle, the environmental noise is offensive to the ear because low frequency noises such as engine noises are emphasized.

In order to eliminate this difficulty, a method has been proposed in the art, as disclosed in the Handbook "600-Type Telephone System," pp. 26-27, published July 1964 by the Telecommunications Association, in which the voice amplifier is operated with a low gain when the voice input is equal to or lower than a predetermined level Pa and with a high gain when the same is higher than the predetermined level Pa. However, this method is disadvantageous in that, when the voice input level is around Pa, the amplified output level varies abruptly and thus the aural transmission does not seem natural. Further, if the difference between the two gains is reduced in order to eliminate the aforementioned drawback, it is rather difficult to eliminate the drawback attributable to environmental noise.

SUMMARY OF THE INVENTION

Accordingly, an object of this invention is to eliminate the above-described drawbacks accompanying a conventional aural transmitter device. More specifically, an object of the invention is to provide an aural transmitter device in which an expansion characteristic is provided as the transmitter input and output characteristic when the input to the aural transmitter is of low level or only environmental noises are applied thereto, and in which an ordinary proportional characteristic is provided when the input to the aural transmitter is at a high level, whereby a non-uniform variation of the output due to variations of the transmitter input level can be prevented, the effect of environmental noises is decreased, and the aural transmission seems natural.

Another object of this invention is to provide an aural transmitter device in which a non-linear input-output characteristic is provided, and wherein a frequency characteristic is given to the input-output characteristic thus provided, whereby the effect of environmental noises is minimized.

Another object of the invention is to provide an aural transmitter device, in which the effects of environmental noise are minimized by imparting a non-linear input-output characteristic to the voice amplifier.

DETAILED DESCRIPTION OF THE PREFERRED EMBODIMENTS

One example of an aural transmitter device according to this invention will now be described with reference to FIG. 1.

Figure 1:
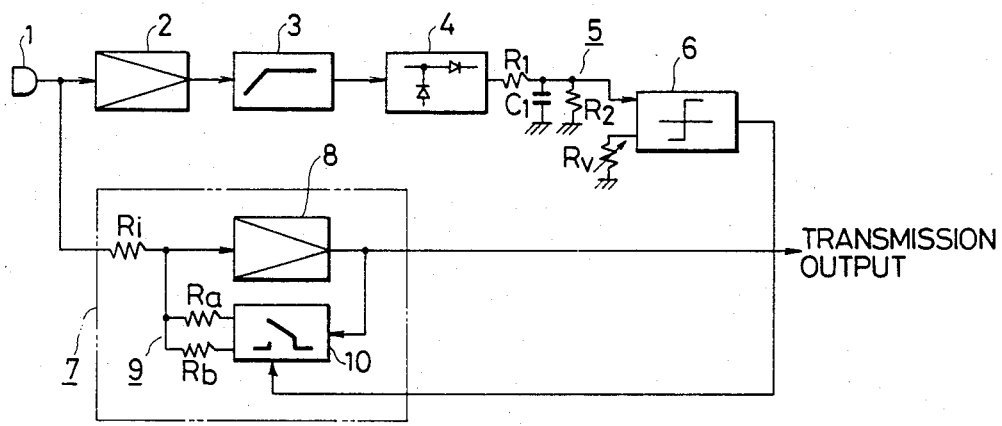
FIG. 1 is a block diagram showing a first example of an aural transmitter device according to the invention.

In FIG. 1, reference numeral 1 designates an aural transmitter for converting an aural wave into an electrical signal (or a sound signal); and at 2 is an amplifier for amplifying the output of the transmitter 1 to a level such that the output can be rectified. A high-pass filter 3 having a cut-off frequency of about 1 kHz transmits the sound signal thus amplified, and a rectifier circuit 4 rectifies the output of the high-pass filter, the output of the rectifier circuit 4 being applied to a smoothing circuit 5 comprising resistors $R_1$ and $R_2$ and a capacitor $C_1$ where a ripple component is removed therefrom. A voltage comparator 6 is provided with a variable resistor $R_V$ for setting a voltage comparison point. Reference numeral 7 represents a voice feedback amplifier.

In the voltage comparator 6, the voltage set by the variable resistor $R_V$ is compared with the output voltage of the smoothing circuit 5, and a high or low level signal is outputted according to the result. The voice feedback amplifier 7 comprises a voice amplifier 8 made up of an operational amplifier; a feedback circuit 9 including an input resistor $R_i$; and an analog switch 10 for switching feedback resistors $R_a$ and $R_b$ in response to the output of the voltage comparator 6.

Figure 2:
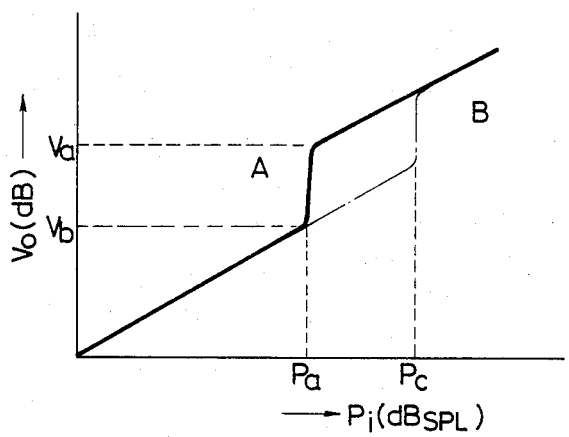
FIG. 2 is a graphical representation indicating the input-output characteristic of the device of FIG. 1.

FIG. 2 is a graphical representation indicating the input-output characteristic of the aural transmitter device of FIG. 1. In FIG. 2, the horizontal axis represents an input sound pressure $P_i$ applied to the aural transmitter 1, and the vertical axis represents the output voltage $V_o$ of the voice feedback amplifier 7.

The operation of the device of FIG. 1 will now be described with reference to FIG. 2. When sound is applied to the transmitter 1, the output of the latter is amplified to a suitable level, and is then applied to the high-pass filter 3. Since the cut-off frequency of the high-pass filter 3 is about 1 kHz as described above, the audio component is passed through the high-pass filter as it is, and is then rectified and smoothed respectively by the rectifier circuit 4 and the smoothing circuit 5. The reference voltage $E_a$ is set by the variable resistor $R_V$ of the voltage comparator 6 such that it is equal to an output voltage provided by the smoothing circuit when the input sound pressure ($P_i$) is $P_a$ during aural transmission. When the input sound pressure ($P_i$) is higher than $P_a$, the output of the voltage comparator 6 operates to connect the analog switch 10 to the feedback resistor $R_a$; and when the input sound pressure ($P_i$) is lower than $P_a$, the output of the voltage comparator 6 operates to connect the analog switch 10 to the feedback resistor $R_b$. The relation between the gains of the voice feedback amplifier 7 in the two cases mentioned above is as follows:

$$20 \log \frac{R_a}{R_i} > 20 \log \frac{R_b}{R_i}$$

where $R_a > R_b$. Therefore, the gain difference, i.e., the output level difference is ($V_a - V_b$) dB.

Accordingly, if the level ($PN_1$) of an environmental noise higher than 1 kHz applied to the aural transmitter 1 is smaller than $P_a$ ($PN_1 < P_a$), and if during aural transmission the sound pressure level ($P_s$) is larger than $P_a$ ($P_s > P_a$), then the output $V_o$ of the voice feedback amplifier 7 when aural transmission is effected is increased by ($V_a - V_b$) dB when compared with that when aural transmission is not effected (or when a noise signal is input). That is, the difficulty in hearing due to the environmental noise is reduced by ($V_a - V_b$) dB when compared with the case of the conventional aural transmitter device.

The above-described sound pressure input-output characteristic higher than 1 kHz is indicated by the curve (A) in FIG. 2.

Environmental noise, the frequency components of which are lower than 1 kHz, is attenuated by the high-pass filter 3. Therefore, the sound pressure level ($PN_2$) of the noise would have to be increased to $P_c$ (FIG. 2) to reach the high gain region of the voice feedback amplifier 7. In the case where the noise frequency is lower than 1 kHz, as the frequency is decreased, the gain of the voice feedback amplifier 7 is maintained low until the sound pressure becomes larger than $P_c$. This is very effective in eliminating noises lower than 1 kHz, for instance when the aural transmitter device is installed on an automobile. In FIG. 2, the degree of allowance for noises lower than 1 kHz corresponds to ($P_c - P_a$) dB in terms of the input sound pressure.

When the input value PN to the transmitter 1 is abruptly switched to the input value $P_s$, or vice versa, the step response of the smoothing circuit 5, i.e., the switching response time of the analog switch 10 is determined by the values of the circuit elements $R_1$, $C_1$ and $R_2$. In order to make $R_1 C_1 = t_1$ short to thereby prevent the top of a voice from being cut off due to the input level variation when the voice rises, and in order to make $R_2 C_1 = t_2$ long to thereby avoid a voice being cut off during transmission, the resistance of the resistor $R_1$ is made smaller than that of the resistor $R_2$ ($R_1 < R_2$).

When the input sound pressure $P_i$ varies around $P_a$, a so-called chattering phenomenon occurs in which the output voltage $V_o$ varies between $V_a$ and $V_b$. This difficulty may be eliminated by connecting the output of the voltage comparator 6 through a feedback resistor $R_f$ to the input of the same as shown in FIG. 3, to thereby allow the voltage comparator 6 to have a hysteresis characteristic.

Figure 3:
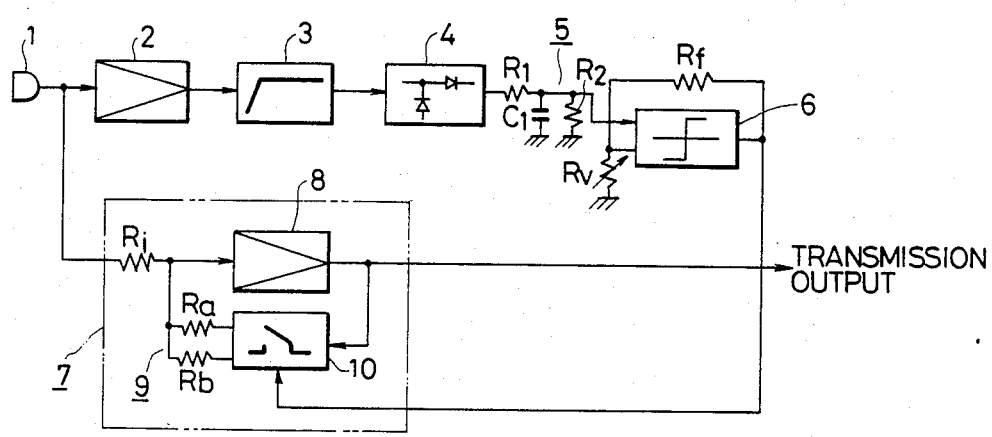
FIG. 3 is a block diagram showing a second example of the device according to the invention, which is given a hysteresis characteristic.
Figure 4:
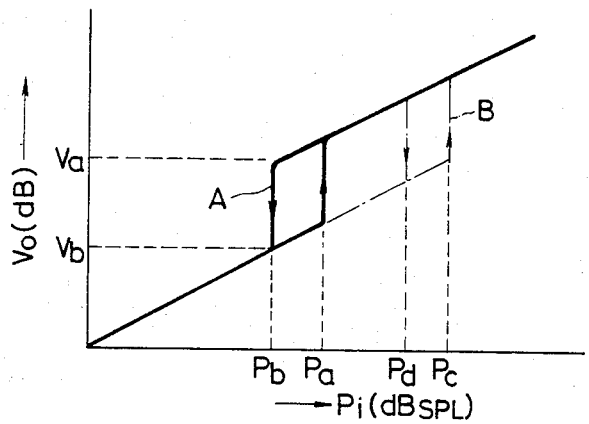
FIG. 4 is a graphical representation indicating one example of the input-output characteristic of the device of FIG. 3.

FIG. 4 shows the input-output characteristic of the aural transmitter device of FIG. 3. As is clear from FIG. 4, if the input sound pressure becomes larger than Pa during aural transmission, the gain of the voice feedback amplifier 7 is raised and then maintained unchanged until the sound pressure is decreased to $P_b$. Accordingly, when compared with the aural transmitter device of FIG. 1, the gain of the voice feed-back amplifier 7 of the device of FIG. 3 is less dependent on sound pressure variations during transmission. Thus, voices are outputted more naturally. The amount of hysteresis ($P_a - P_b$) dB is determined by the ratio of the resistance of the feedback resistor $R_f$ to that of the variable resistor $R_V$.

Figure 5:
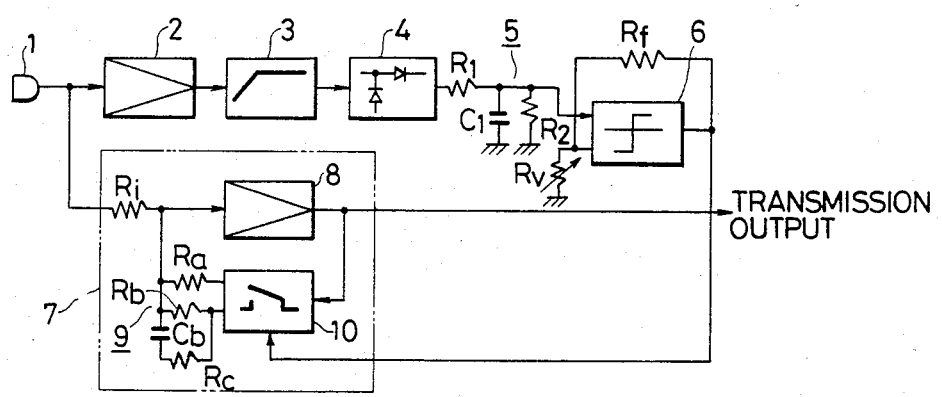
FIG. 5 is a block diagram showing a third example of the device according to the invention, in which a frequency characteristic is imparted to the voice feedback amplifier.
Figure 6:
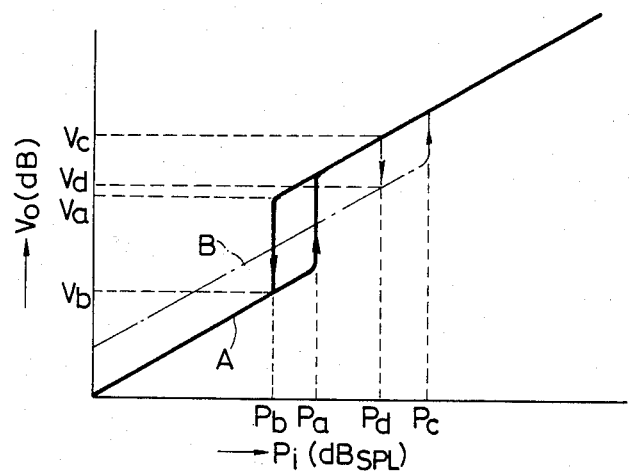
FIG. 6 is a graphical representation indicating the input-output characteristic of the device in FIG. 5.

In the above-described examples of the aural transmitter device according to the invention, the feedback constant of the voice feedback amplifier 7 was determined by the resistors $R_a$ and $R_b$ only. However, a frequency characteristic may be imparted to the voice feedback amplifier 7 by combining a resistor and a capacitor with the feedback circuit 9 as shown in FIG. 5. One example of the input-output characteristic, in this case, is as shown in FIG. 6.

As is apparent from the above description, in the aural transmitter device according to the invention, the output of the aural transmitter is applied to a high-pass filter, and the output of the high-pass filter is rectified and smoothed, and is then compared with a predetermined voltage in a voltage comparator, the output of which is utilized to control the amount of feedback of a voice feedback amplifier, so that the gain of the amplifier is increased when ordinary aural transmission is effected, and decreased when the input sound pressure is low as in the transmission of environmental noises only or when the input sound pressure is high but the frequency components are low as in a case where the device is installed on an automobile. Thus, in the aural transmitter device according to this embodiment of the invention, noise output components offensive to the ear caused by environmental noise can be minimized. Especially when the device is installed on a vehicle, low frequency noises such as engine noises can be effectively eliminated.

Figure 7:
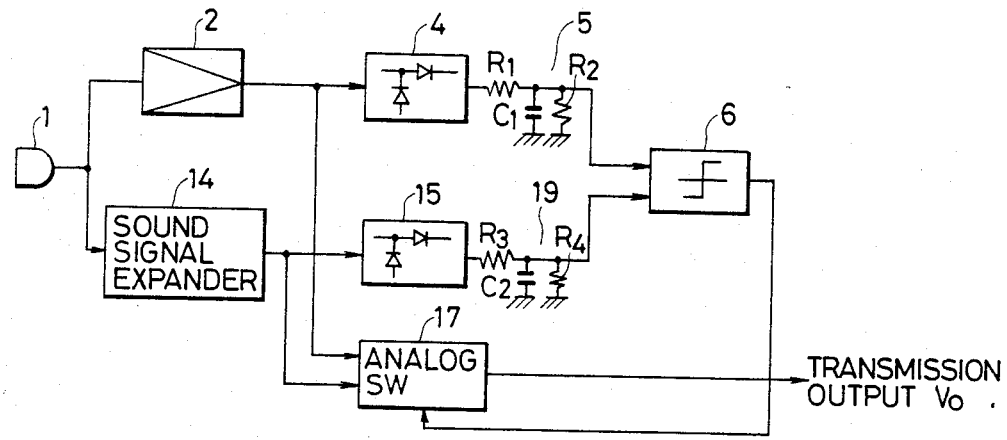
FIG. 7 is a block diagram showing an aural transmitter device according to a further embodiment of this invention.

A further embodiment of this invention will now be described with reference to FIGS. 7 and 8. In FIG. 7, sound signals are applied to aural transmitter 1, and the output thereof is applied to a voice amplifier 2 and a sound signal expander 14. The sound input from the transmitter 1 is amplified to a suitable level by the voice amplifier 2, and is then rectified by rectifier circuit 4. The rectified output of the rectifier circuit 4 is applied to a smoothing circuit 5 comprising resistors $R_1$ and $R_2$ and a capacitor $C_1$, where a ripple component is removed. The output of the smoothing circuit is applied to one input terminal of a voltage comparator 6. The sound signal expander 14 is a variable gain amplifier designed such that over at least part of its output range its output varies by 2 dB as its input varies by 1 dB. The output of the sound signal expander 14 is rectified by a rectifier circuit 15, and the output of the rectifier circuit is applied to a smoothing circuit 19 comprising resistors $R_3$ and $R_4$ and a capacitor $C_2$, where a ripple component is removed. The output of the smoothing circuit 19 is applied to the other input terminal of the voltage comparator 6.

The output of the sound signal expander 14 and the output of the voice amplifier 2 are also applied to two input terminals of an analog switch 17. One of the outputs thus applied to the analog switch 17 is outputted in response to a control signal from the voltage comparator 6.

In the voltage comparator 6, the output voltage of the smoothing circuit 5 is compared with that of the smoothing circuit 19, and a corresponding signal is output therefrom depending upon which signal is lower than the other, this signal being applied as the control signal for the analog switch 17.

Figure 8:
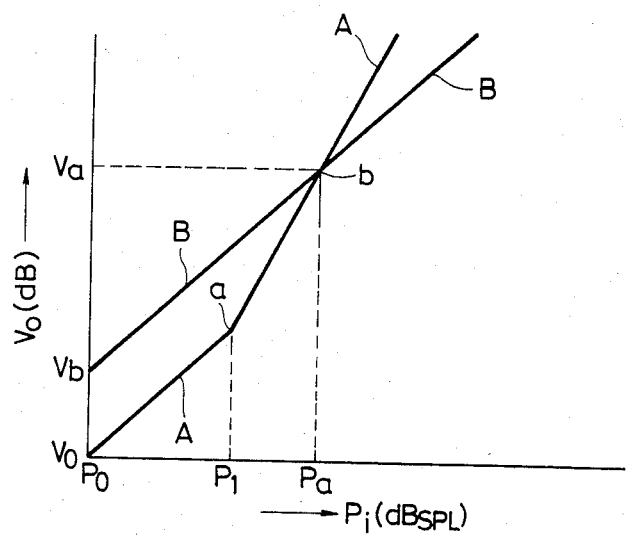
FIG. 8 is a graphical representation showing input and output characteristics of the device of FIG. 7.

FIG. 8 is a graphical representation indicating the input and output characteristics of the aural transmitter device shown in FIG. 7.

In FIG. 8, characteristic (A) indicates the relation between a sound pressure input $P_i$ to the aural transmitter 1 and an output $V_o$ of the sound signal expander 14. That is, in characteristic (A), as the sound pressure input ranges from $P_o$ to $P_i$, the output $V_o$ varies 1 dB as the input $P_i$ is varied 1 dB; and when the sound pressure input is larger than $P_i$, the output $V_o$ varies by 2 dB as the input $P_i$ is varied by 1 dB.

On the other hand, characteristic (B) indicates the relation between the sound pressure input $P_i$ to the aural transmitter 1 and an output $V_o$ of the sound amplifier 2.

As is apparent from FIG. 8, when the input sound pressure $P_i$ to the aural transmitter 1 is lower than $P_a$, the output of the sound signal expander 14 is lower than that of the voice amplifier. Accordingly, in this case, the voltage comparator 6 outputs the control signal which allows the analog switch 7 to select the output of the sound signal expander 14.

When the input $P_i$ to the aural transmitter 1 is gradually increased to $P_a$, the output of the smoothing circuit 5 is lower than that of the smoothing circuit 19, and accordingly the comparator 6 selects the output of the smoothing circuit 5 as the control signal. As a result, the output of the voice amplifier 2 is outputted through the analog switch. That is, in this operation, characteristic (B) is selected.

During normal aural transmission, the input sound pressure is higher than $P_a$, and the aural transmitter input sound pressure is proportional to the aural transmitter device output. When the input to the aural transmitter is environmental noise only and the sound pressure is lower than $P_i$, the output is decreased as much as $(V_b - V_o)$ dB when compared with that of the conventional aural transmitter device in which the input is proportional to the output, and accordingly the output of offensive environmental noise is suppressed. When the sound pressure is between $P_i$ and $P_a$, the gain is changed in the ratio of 1:2 depending on the amount of sound pressure input.

As is apparent from the above description, in the aural transmitter device of this embodiment of the invention, unlike in the conventional device, the variation of the output due to large variations of the input sound pressure is not carried out stepwise, and accordingly the output seems natural even when the voice is stressed during transmission.

The step response of the smoothing circuits when the input to the transmitter is abruptly changed, i.e., the switching speed of the outputs of the voice amplifier 2 and the sound signal expander 14 depends on the values of the circuit elements $R_1$, $R_2$ and $C_1$, and $R_3$, $R_4$ and $C_2$. Thus, in order to prevent the top of a voice from being cut off when the voice rises, $R_1C_1=t_1$ or $R_3C_2=t_2$ should be made short. In order to maintain the tone variation constant during aural transmission, $R_1$ should be smaller than $R_2$ ($R_1<R_2$) so that $R_2C_1=t_3$ or $R_3C_2=t_4$ is long.

When the input sound pressure is near $P_a$, a chattering phenomenon occurs in which the outputs of the voice amplifier 2 and the sound signal expander 14 are alternatively provided as the outputs of the aural transmitter device. The occurrence of this chattering phenomenon is due to the fact that the output of the voltage comparator 6 may change when the inputs to the voltage comparator 6 change only slightly. This difficulty may be prevented by imparting a hysteresis characteristic to the voltage comparator 6, similarly as described above.

As is apparent from the above description, according to the invention, the output of the aural transmitter device is a signal which has passed through the sound signal expander when the aural transmitter input sound pressure is low, as in the case of environmental noise; or through the voice amplifier in which the input is proportional to the output when the aural transmitter input sound pressure is high, as with ordinary voices. Accordingly, a noisy condition caused by the application of environmental noise only to the transmitter is eliminated, and the degree of such elimination changes smoothly with the sound pressure. Accordingly, the output characteristic of the aural transmitter device seems natural.

Figure 9:
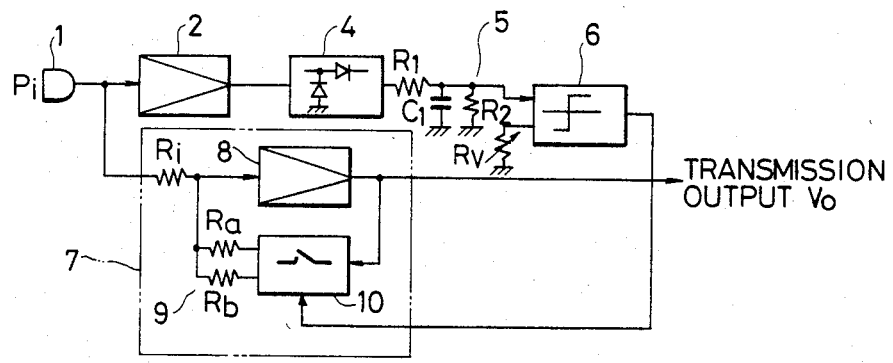
FIG. 9 is a block diagram showing another example of an aural transmitter device according to this invention.
Figure 10:
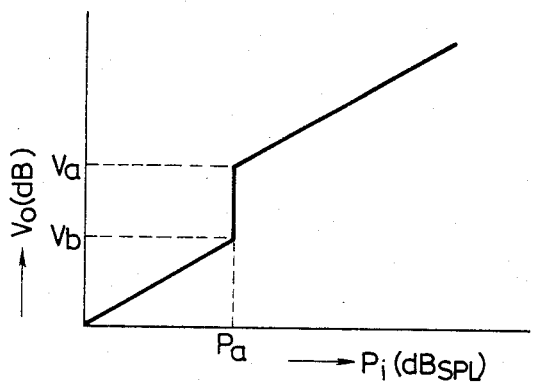
FIG. 10 is a graphical representation indicating the input-output characteristic of the device of FIG. 9.
Figure 11:
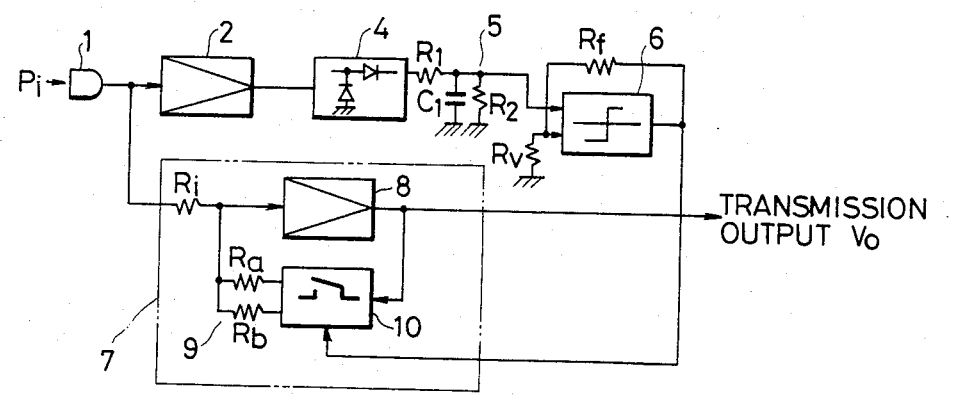
FIG. 11 is a block diagram showing still another example of the aural transmitter device according to the invention.
Figure 12:
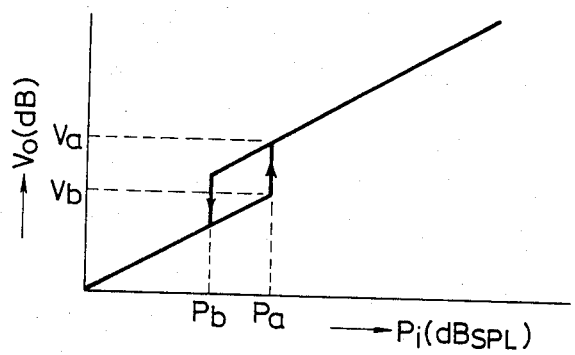
FIG. 12 is a graphical representation indicating the input-output characteristic of the device of FIG. 11.

FIGS. 9 and 11 show further modifications of the invention, and FIGS. 10 and 12 respectively show input-output characteristics of these devices. The embodiments of FIGS. 9 and 11 are substantially similar to those of FIGS. 1 and 3, discussed previously, differing in that the high-pass filter 3 of the prior embodiments has been omitted. Although the filter function is not provided in the present embodiments, good noise elimination characteristics can nonetheless be obtained, as illustrated in FIGS. 10 and 12. Where low frequency noises do not pose a special problem, the embodiments of FIGS. 9 and 11 can operate as efficiently and with the same effect as the devices of FIGS. 1 and 3. Therefore, according to the invention noise output components due to environmental noise can be effectively minimized, resulting in an aural transmitter device of superior sound quality.

What is claimed is:

1. An aural transmitter device, comprising:
   a voice feedback amplifier having feedback circuit means for controlling an amplification degree thereof, for amplifying an audio signal input to the transmitter device;
   a rectifier circuit means for rectifying said signal;
   smoothing circuit means for smoothing an output of said rectifier; and
   comparator means for comparing an output voltage of said smoothing circuit means with a reference voltage;
   the amount of feedback of said voice feedback amplifier being controlled according to an output of said comparator means, said feedback causing a larger amplification when said output voltage of said smoothing circuit means is above said reference voltage and causing a smaller but positive amplification when below said reference voltage.

2. A device as claimed in claim 1, further including high-pass filter means having a cut-off frequency of about 1 kHz connected between the audio signal input to said voice feedback amplifier and said rectifier.

3. A device as claimed in claim 1, wherein a rise or charging time of said smoothing circuit is shorter than a fall or discharge time of the same.

4. A device as claimed in claim 1, said comparator means operating to output two distinct signals, respectively, in response to the result of the comparison between said output voltage of said smoothing circuit and said reference voltage.

5. A device as claimed in claim 1, further including means for imparting a hysteresis characteristic to the output of said comparator means.

6. An aural transmitter device, comprising:
   a first amplifier for amplifying an input sound signal with a predetermined gain and producing an output level;
   a second amplifier for amplifying said sound signal with a dynamic gain lower than that of said first amplifier when said sound signal is lower than a predetermined level and with a dynamic gain higher than that of said first amplifier when said sound signal is higher than said predetermined level, said second amplifier producing an output level;
   comparator means for comparing the output levels of said first and second amplifiers, to output a control signal designating the smaller of said output levels of said first and second amplifiers; and
   switch means operated by said control signal from said comparator means, for selectively providing as an output signal either the output of said first amplifier or the output of said second amplifier.

7. A device as claimed in claim 6, further comprising means for smoothing and rectifying outputs of said respective first and second amplifiers, interposed between said amplifiers and said comparator means.

8. A device as claimed in claim 7, said smoothing and rectifying means comprising first and second smoothing circuits, having a rise time is shorter than a fall time thereof.

9. A device as claimed in claim 8, wherein said comparator means outputs different signals corresponding to the result of comparison of output levels of said first and second smoothing circuits.

10. A device as claimed in claim 6, and including means for providing said comparator means with a DC hysteresis characteristic.

* * * * *